(12) United States Patent
Ramaraju

(10) Patent No.: US 8,908,449 B1
(45) Date of Patent: Dec. 9, 2014

(54) MASTER-SLAVE FLIP-FLOP WITH REDUCED SETUP TIME

(71) Applicant: Freescale Semiconductor, Inc., Austin, TX (US)

(72) Inventor: Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/022,872

(22) Filed: Sep. 10, 2013

(51) Int. Cl.
G11C 7/10 (2006.01)
H03K 3/037 (2006.01)
G11C 11/419 (2006.01)

(52) U.S. Cl.
CPC ............ *G11C 11/419* (2013.01); *H03K 3/0372* (2013.01)
USPC ................. 365/189.17; 365/154; 365/189.05; 365/205

(58) Field of Classification Search
CPC ............................ G11C 7/1051; G11C 11/412
USPC .............................. 365/189.05, 189.17, 205
See application file for complete search history.

(56) References Cited

U.S. PATENT DOCUMENTS

| | | | |
|---|---|---|---|
| 5,289,415 A | 2/1994 | DiMarco et al. | |
| 5,764,089 A | 6/1998 | Partovi et al. | |
| 7,245,150 B2 | 7/2007 | Goel et al. | |
| 7,414,449 B2 | 8/2008 | Russell et al. | |
| 7,495,493 B2 | 2/2009 | Ramaraju | |
| 7,499,342 B2 | 3/2009 | Bajkowski et al. | |
| 7,548,102 B2 | 6/2009 | Ramaraju et al. | |
| 7,548,103 B2 | 6/2009 | Ramaraju et al. | |
| 7,843,218 B1 | 11/2010 | Ramaraju et al. | |
| 8,026,754 B2 | 9/2011 | Trivedi et al. | |
| 8,067,971 B2 | 11/2011 | Hoxey | |
| 8,143,929 B2 | 3/2012 | Ramaraju et al. | |
| 2002/0093368 A1 | 7/2002 | Fulkerson | |
| 2007/0063752 A1 | 3/2007 | Kowalczyk et al. | |
| 2008/0024184 A1 | 1/2008 | Wang | |
| 2010/0259309 A1* | 10/2010 | Biyani | 327/202 |
| 2010/0264972 A1 | 10/2010 | Chi et al. | |
| 2011/0095799 A1 | 4/2011 | Ramaraju et al. | |
| 2011/0239069 A1 | 9/2011 | Ramaraju et al. | |
| 2012/0306556 A1 | 12/2012 | Ramaraju | |
| 2013/0154708 A1* | 6/2013 | Zhang et al. | 327/202 |
| 2013/0155781 A1 | 6/2013 | Kottapalli et al. | |
| 2013/0155783 A1 | 6/2013 | Kottapalli et al. | |

OTHER PUBLICATIONS

Dillen, S., et al., "Design and Implementation of Soft-Edge Flip-Flops for x86-64 AMD Microprocessor Modules", Custom Integrated Circuits Conference (CICC) 2012 IEEE, Sep. 9, 2012, IEEE, US.

(Continued)

*Primary Examiner* — Hoai V Ho

(57) ABSTRACT

A master stage (502) of a master-slave flip-flop (500) includes an input terminal (504) for receiving the data-in signal, an output terminal, and terminals for receiving first clock signals, a transmission gate (522) coupled to the input terminal and having an output terminal, a storage element (520) coupled to the output terminal of the transmission gate, and a two-input logic gate (525) having a first input terminal (541) coupled to the storage element, a parallel input terminal (542) coupled to the input terminal of the master stage, and an output terminal (543) that provides an output terminal of the master stage. A slave stage (503) has terminals for receiving second clock signals, wherein first clock signals are delayed relative to second clock signals.

20 Claims, 7 Drawing Sheets

(56) References Cited

OTHER PUBLICATIONS

McIntyre, H., et al., "Design of the Two-Core x86-64 AMD "Bulldozer" Module in 32 nm SOI CMOS", IEEE Journal of Solid-State Circuits, Jan. 2012, pp. 164-176, vol. 47, No. 1, IEEE, US.

Fischer, T., et al., "Design Solutions for the Bulldozer 32nm SOI 2-Core Processor Module in an 8-Core CPU", ISSCC 2011, Session 4, Enterprise Processors & Components, Feb. 21, 2011, pp. 78-80, IEEE, US.

Joshi , V., et al., "Soft-Edge Flip-flops for Improved Timing Yield: Design and Optimization", Nov. 4-8, 2007, pp. 667-673, IEEE, US.

\* cited by examiner

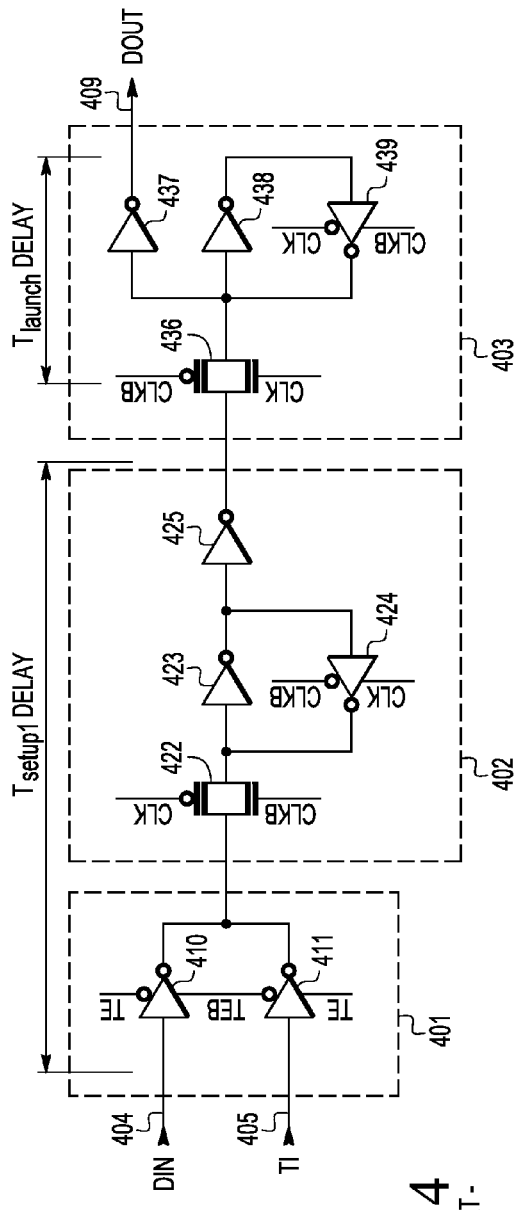
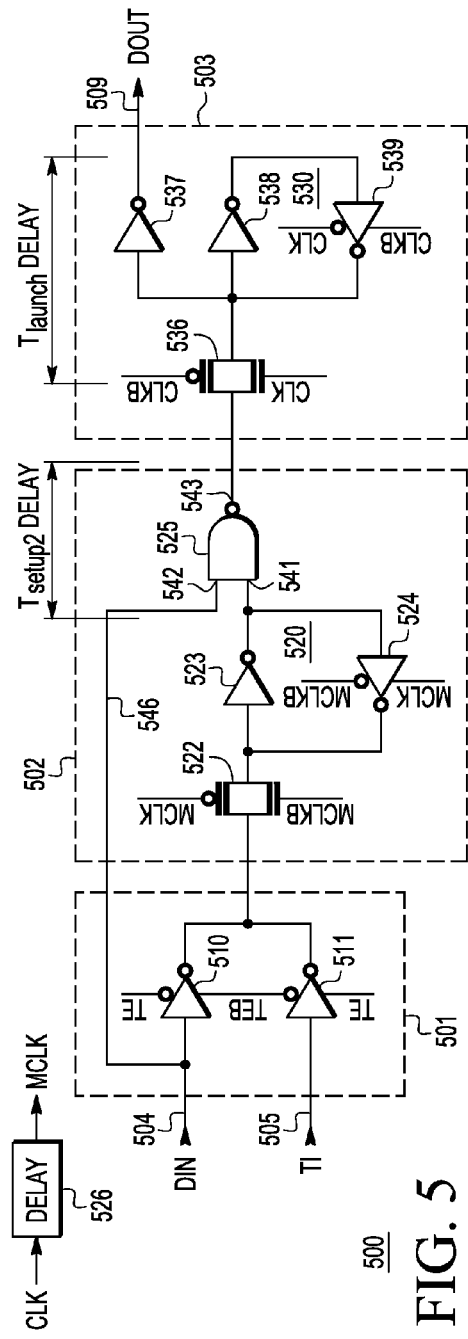
FIG. 4
-PRIOR ART-
FIG. 5

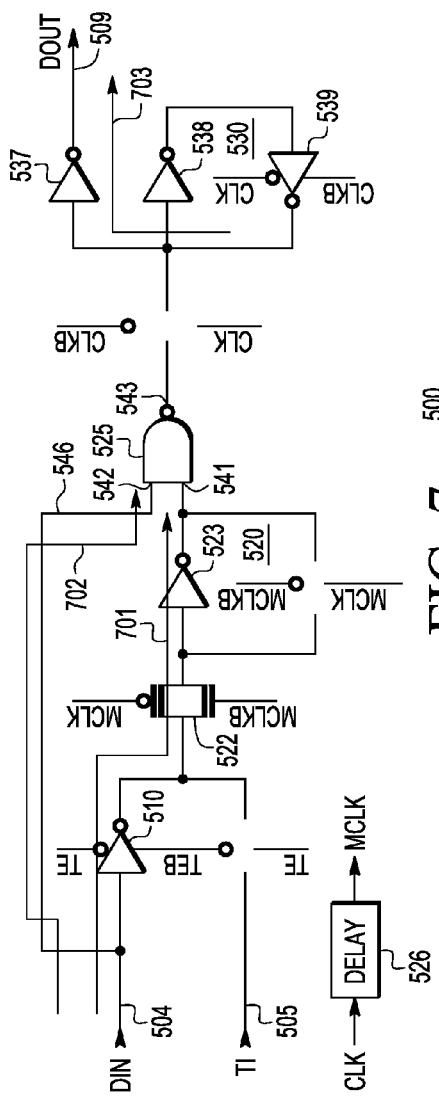
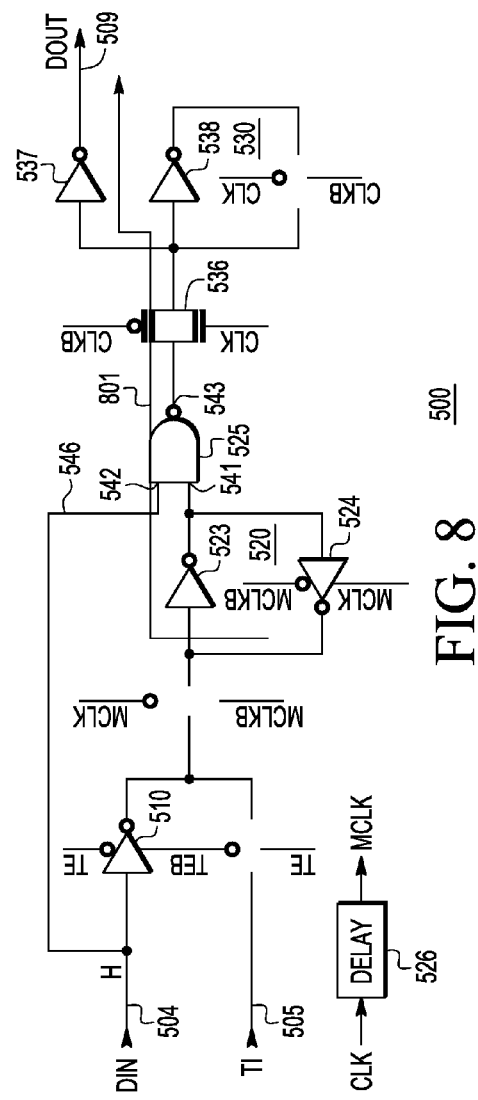
FIG. 7
FIG. 8

MASTER-SLAVE FLIP-FLOP WITH REDUCED SETUP TIME

BACKGROUND

1. Field

This invention relates generally to electronic circuits and more particularly to a master-slave flip-flop.

2. Related Art

Flip-flops are typically used for storing a single bit of data. One type of flip-flop is a master-slave flip-flop. A master-slave flip-flop (MSFF) includes two storage elements, or latches, operating in series.

An input terminal of a MSFF may be coupled to an output terminal of a circuit that provides dynamically changing digital data to the MSFF. The circuit that provides the dynamically changing digital data may be a memory. The memory may include a plurality of bitcells and at least one sense amplifier with an output node of a sense amplifier coupled to an input terminal of the MSFF. A setup time of the MSFF is a factor that should be considered when inputting data to the MSFF.

A setup time of a flip-flop is the minimum amount of time an input signal should be held steady before a clock event so that the input data is reliably sampled. A hold time of a flip-flop is the minimum amount of time the input signal should be held steady after the clock event so that the input signal is reliably sampled. A clock-to-Q launch delay of a flip-flop is an interval between occurrence of the clock event and occurrence of an output signal, at an output terminal of the flip-flop, representative of a state of an input signal at the clock event. A clock-to-$D_{out}$ launch delay of a MSFF is an interval between occurrence of the clock event and occurrence of an output signal, at an output terminal of the MSFF, the output being representative of a state of an input signal at the clock event. A $data_{in}$-to-$data_{out}$ lag of a MSFF is equal to a setup delay plus a launch delay, where the setup delay is $D_{in}$-to-clock, and the launch delay is clock-to-$D_{out}$.

When a wordline and a bitline of a memory are selected, a differential voltage outputted by a selected bitcell increases with time. A value of such differential voltage is dependent, in part, on duration that the bitline is asserted, and, in part on strength of the bitcell. The sense amplifier is a high gain amplifier which, when enabled, amplifies the differential voltage outputted by the bitcell. A value of such amplified differential voltage is dependent, in part, on duration of an interval between when the bitline is asserted and when a sense enable signal is asserted, and, in part, on a gain of the sense amplifier. The amplified differential voltage may be outputted by the sense amplifier to a MSFF. Determination of data out of the memory depends on detection by the MSFF of the value of the amplified differential voltage outputted by the sense amplifier. If data out of the memory is required to arrive earlier, i.e., if detection by the MSFF is desired to occur sooner, then two known options are available: 1) use a larger, i.e., stronger, bitcell, but this option disadvantageously results in more area and more power consumption, and 2) reduce a detection threshold for the differential voltage that appears at an input of the sense amplifier, but this option disadvantageously increases a possibility of a read failure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 is a schematic of a known MSFF.

FIG. 5 is a schematic of one parallel MSFF of FIG. 1.

FIG. 7 shows the condition of the circuitry of the parallel MSFF of FIG. 1 in normal mode when a clock signal is low.

FIG. 8 shows the condition of the circuitry of the parallel MSFF of FIG. 1 in normal mode when the clock signal is high.

DETAILED DESCRIPTION

The term "coupled", as used herein, is defined as "connected", and encompasses the coupling of devices that may be physically, electrically or communicatively connected (according to context), although the coupling may not necessarily be directly, and not necessarily be mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. The term "transmission gate" is any switch or electrical component capable of interrupting current flow in a circuit.

For each repetitive waveform, e.g., CLK and MCLK, an inverse of the repetitive waveform is represented by adding a "B" suffix to its name, e.g., CLKB and MCLKB, respectively. For each digital value, e.g., TE, a complement of the digital value is represented by adding a "B" suffix to its name, e.g., TEB.

Figure 1:
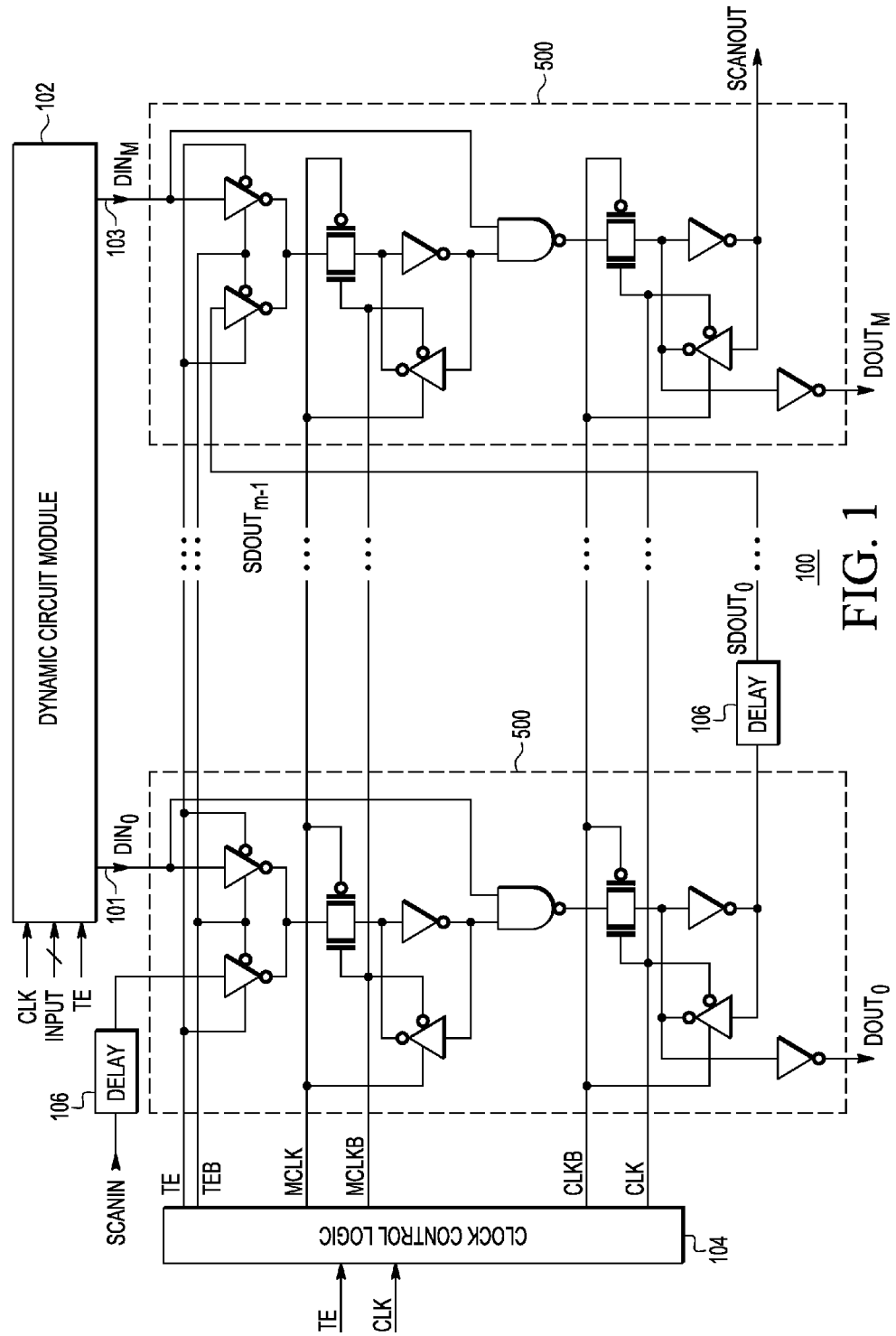
FIG. 1 is a functional block diagram of a memory system including a dynamic circuit module, at least one parallel MSFF in accordance with the invention, and clock control logic.

FIG. 1 is a functional block diagram of a system 100 which includes a dynamic circuit module (hereinafter "module") 102 that outputs one or more dynamic digital signals 101 and 103. The system 100 also includes at least one parallel MSFF (hereinafter "PMSFF") 500 in accordance with the invention. An input terminal of a PMSFF 500 receives the dynamic digital signal 101 outputted by the module 102. An input terminal of another PMSFF 500 receives the dynamic digital signal 103 outputted by the module 102. Clock control logic 104 is coupled to each of the at least one PMSFF 500. The module 102 and the clock control logic 104 are coupled to a clock generating circuit (not shown).

The PMSFF 500 may include a test control stage 501, and the PMSFF includes a master stage (hereinafter "master") 502 and a slave stage (hereinafter "slave") 503. In one embodiment, each stage of the PMSFF 500 comprises a D type flip-flop. In other embodiments, each stage of the PMSFF 500 may comprise another type of flip-flop. A more detailed description of the PMSFF 500 is provided hereinbelow with respect to FIG. 5.

The module 102 and the PMSFF 500 are both aligned to a same transition of a clock signal—in one embodiment, a rising edge of the clock signal. Advantageously, the PMSFF 500 gives more time to the module 102 to finish a logical operation without a need to slow a clock cycle of the module. It is a prerequisite that the dynamic digital signal 101 of the module 102 be in a stable known state, when the master 502 of the PMSFF 500 is non-transparent. When the master 502 is in a non-transparent state, the master holds a value of the output signal of the master. When the master 502 is in a transparent state, the master does not necessarily hold the value of the output signal of the master.

FIG. 1 includes a delay element 106 at a test-input (TI) terminal of each PMSFF 500 in accordance with a first embodiment of the PMSFF in test mode. A more detailed description of the first embodiment of the PMSFF 500 in test mode is provided hereinbelow with respect to FIG. 9.

The PMSFF 500 can be used with accessing any cycle-bound memory. A compiled memory is cycle bound and has at least one MSFF at its input and at least one MSFF at its output. In a cycle-bound memory, input data, e.g., address and control signals, are setup to a rising edge of a clock, and output data, which corresponds to the address that was setup in the previous rising edge of the clock, becomes available. More specifically, the PMSFF 500 can be used with a compiled memory. In one embodiment, the module 102 is a full-cycle based compiled memory, and the system 100 is a memory system. A compiled memory satisfies the prerequisite that the output of the module 102 be in a stable known state, when the master 502 of the PMSFF 500 is non-transparent. Stated more generically: the master 502 of the PMSFF 500 is transparent when the clock is active and non-transparent when the clock is inactive.

Figure 2:
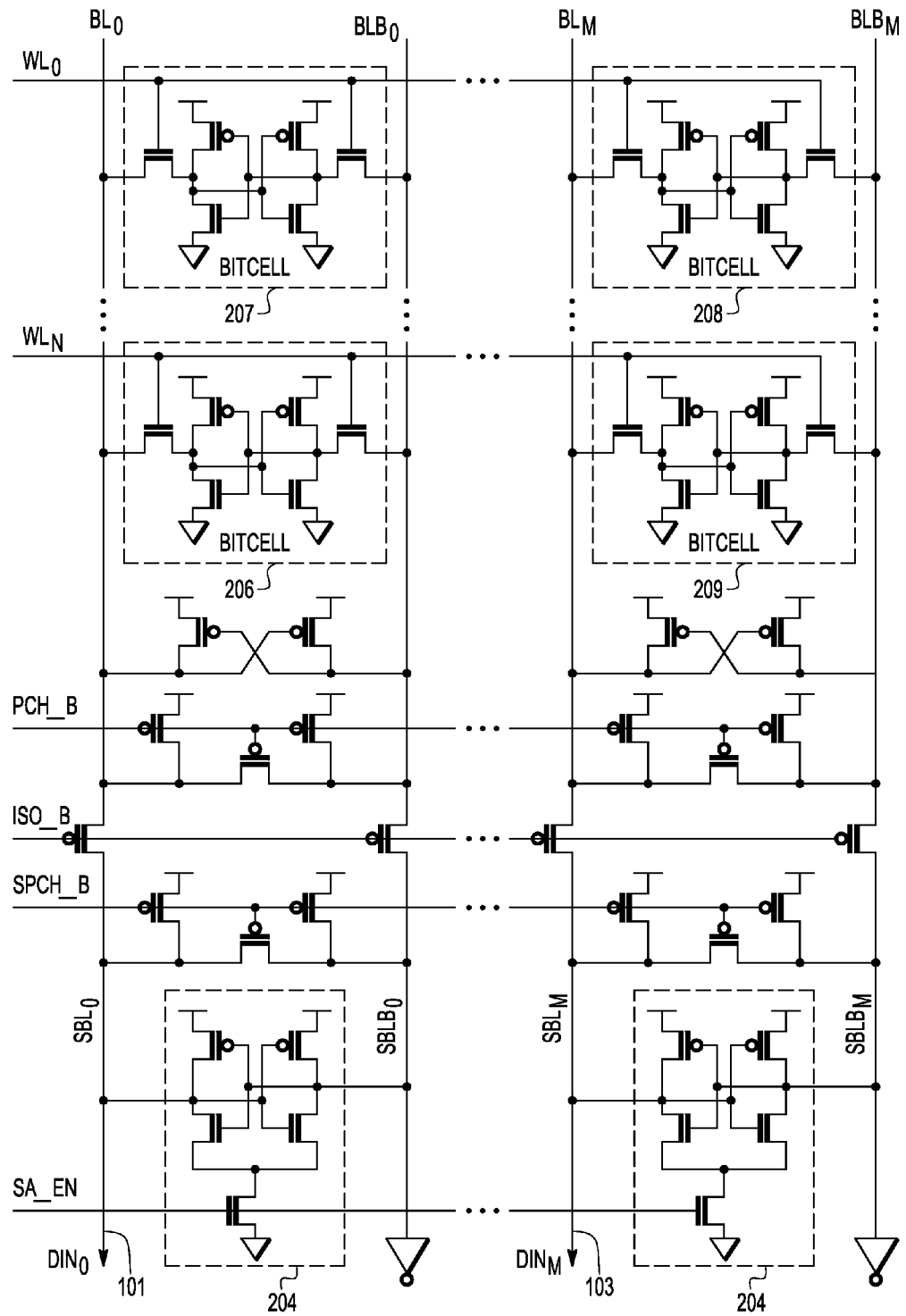
FIG. 2 is an abbreviated representation of two columns and two rows of an N row by M column static random access memory, which is one example of the dynamic circuit module of FIG. 1.

In one embodiment, the compiled memory is an N row by M column static random access memory (SRAM) 202. FIG. 2 is an abbreviated representation of two columns and two rows of the N row by M column SRAM 202. In one embodiment, the module 102 is the SRAM 202. The following description is applicable to a PMSFF 500 located at the output of the SRAM 202.

The SRAM 202 takes an address at a rising edge of a clock, reads data corresponding to such address, and outputs the data corresponding to such address at a next rising edge of the clock. There are certain advantages to giving the SRAM 202 more time to perform a read. However, when the SRAM 202 is given more time to perform a read, the data out of the SRAM is delayed. In the system 100, the SRAM is advantageously given more time to perform a read. In the system 100, the PMSFF 500 reliably latches data from the SRAM 202 and then outputs such data in a timely fashion in spite of the aforementioned delay of the data out of the SRAM.

The SRAM 202 includes an improved sense amplifier 204 in accordance with the invention and a plurality of bitcells 206-209, as illustrated in FIG. 2. Each improved sense amplifier 204 has an SBL output node and a complimentary SBLB output node, e.g., an $SBL_0$ output node and an $SBLB_0$ output node. In one embodiment, one of the SBL output node and the complimentary SBLB output node is coupled to an input terminal of the PMSFF 500. In the illustrated embodiment, the $SBL_0$ output node is coupled to an input terminal 504 (see FIG. 5) of the PMSFF 500, and the improved sense amplifier 204 outputs the dynamic digital signal 101 to the PMSFF via the $SBL_0$ output node. In many instances, it is advantageous to reduce the setup time of a MSFF that is coupled to an output node of a sense amplifier. The PMSFF 500 has a shorter, or reduced, setup time than known MSFFs such as the known MSFF 400 (see FIG. 4). A reduction in setup time allows the improved sense amplifier 204 additional time to develop a larger differential voltage and consequently sense a larger differential voltage. The improved sense amplifier 204 is provided a larger differential voltage to sense, therefore, the improved sense amplifier is more robust, and should result in fewer failures.

Figure 3:
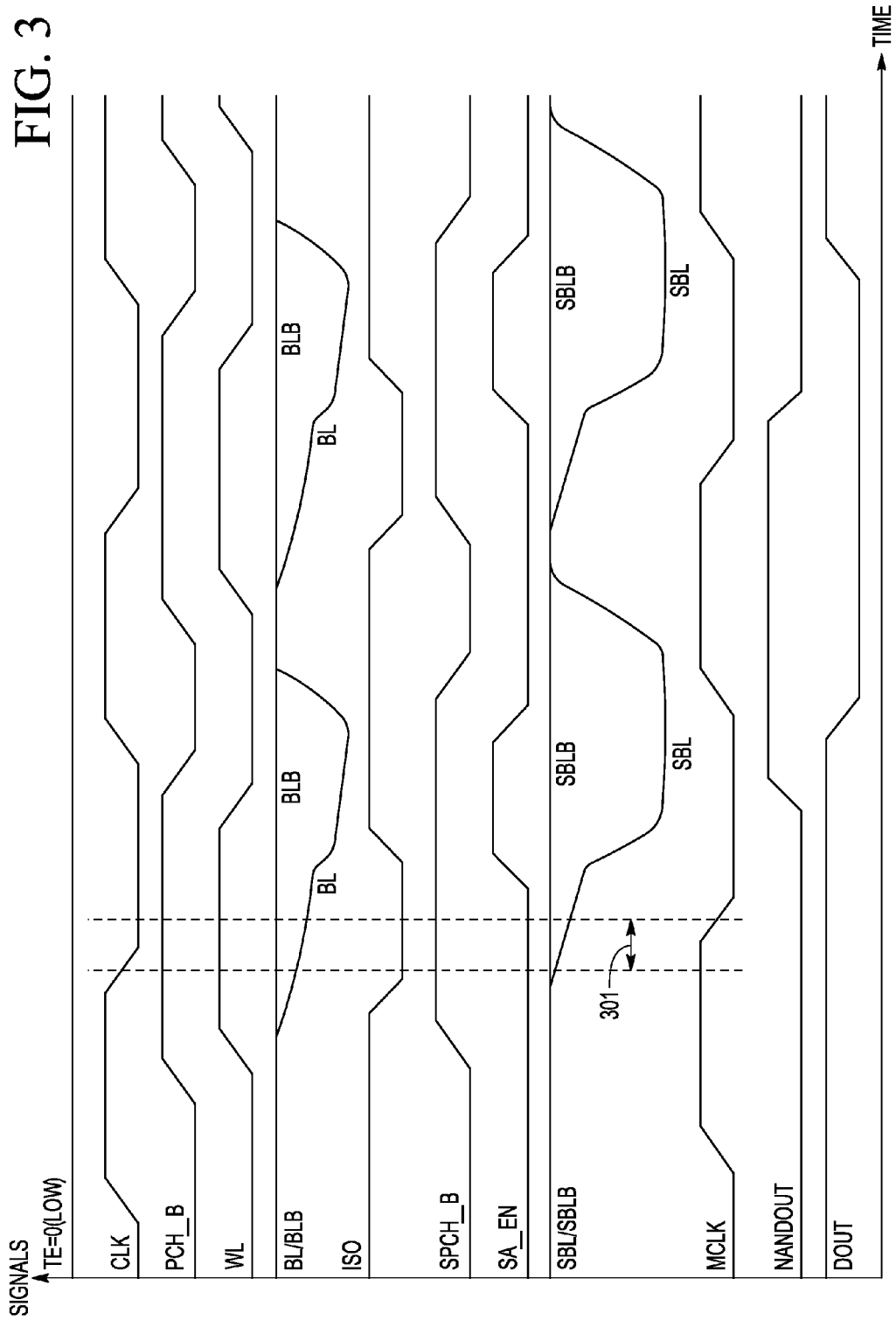
FIG. 3 is a timing diagram of various signals in one parallel MSFF of FIG. 1 and in the static random access memory of FIG. 2.

FIG. 3 is a timing diagram of various signals in the SRAM 202 and in the PMSFF 500. FIG. 3 shows a clock (CLK) signal. FIG. 3 also shows that MCLK is delayed relative to CLK by a delay 301. Hereinafter, an amount of time of the delay 301 is referred to as $t_{delay}$.

Referring now to FIGS. 1-3. The operation of an SRAM 202 is well known; nevertheless, a brief summary of the operation of the SRAM 202 is provided as follows. A rising edge of CLK launches a read access to the SRAM 202. A precharge signal (PCH_B) controls operation of three PMOS field-effect transistors. The rising edge of PCH_B turns off the three PMOS field-effect transistors which were precharging the bitline (BL) and BLB high. In the illustrated embodiment, it is assumed that BL and BLB are precharged high. In another embodiment of the sense amplifier (not shown) BL and BLB can be precharged low. A wordline corresponding to the input address is enabled. The wordline (WL) signal is turned on as soon as feasible after the three PMOS field-effect transistors are turned off because any delay in turning on WL disadvantageously adds to a clock-to-$D_{out}$ delay. After WL is turned on, BL and BLB start to develop a differential voltage based on a value stored in a selected bitcell 206. One of BL and BLB goes low, while the other stays high; the one that goes low depends on whether a logical "0" or a logical "1" is stored in the selected bitcell 206 being read. Then, the pre-charging in the improved sense amplifier 204 is disabled by a rising sense-precharge (SPCH_B) signal. Next, an isolation signal (ISO_B) is goes low, which opens the isolation (ISO) gates to transfer the differential developed at BL and BLB to SBL and SBLB, respectively.

After the ISO_B signal goes low, a sense enable (SA_EN) signal goes high. The SA_EN signal triggers the sense amplifier to evaluate the data. Then, ISO_B goes high and WL goes low to save power. Finally, precharge is again enabled, by PCH_B going low, and the data is presented at the SBL output node of the improved sense amplifier 204.

Other embodiments of the improved sense amplifier 204 are possible. The PMSFF 500 can also be coupled to such other embodiments of the improved sense amplifier 204. The PMSFF 500 and the improved sense amplifier 204 share a same CLK. The PMSFF 500 takes advantage of the fact that the SA_EN signal of the improved sense amplifier 204 is a dynamic signal having a same frequency as the CLK.

The at the SBL output of the improved sense amplifier 204 satisfies the prerequisite that the input to the PMSFF 500 be is in a stable known state, when the master 502 of the PMSFF 500 is non-transparent, in that the SBL output of the improved sense amplifier is in a stable high state when the master of the PMSFF is non-transparent.

A strength of the selected bitcell 206, measured in mV/ps, defines an angle of a first-in-time, shallow portion of a downward slope of SBL, as shown in FIG. 3. An advantage of delaying the SA_EN signal is that a smaller, i.e., weaker, bitcell 206 can be used. A smaller bitcell 206 would produce a shallower initial slope of SBL. However, when the improved sense amplifier 204 is used with the PMSFF 500, the shallow slope is allowed to continue farther to the right on the timeline. As a result, a differential voltage can be developed that has a same magnitude as a differential voltage developed with a larger, i.e., stronger, bitcell 206. A gain of the improved sense amplifier 204 defines the angle of a later-in-time, steep portion of the downward slope of SBL, as shown in FIG. 3.

In general, a differential development time is defined as an interval from a transition of a clock signal to a transition of a sense enable signal. In the illustrated embodiment of the improved sense amplifier 204, the differential development time is an interval from a center of a falling edge of CLK to a center of a rising edge of SA_EN. With the improved sense amplifier 204, the differential development time is extended because the rising edge of SA_EN is advantageously delayed compared to when the rising edge of SA_EN occurs with the known sense amplifier. In a given technology, with the improved sense amplifier 204, the SA_EN signal can be delayed about 2½ gate delays. In other words, the shallow downward slope of SBL exists for an additional interval of time equivalent to about 2½ gate delays before the steep downward slope occurs.

FIG. 4 is a schematic of a known MSFF 400. An arrow indicates a distance of a known signal path and four components in the known signal path responsible for at $t_{setup1}$ delay. These four components are a tri-state inverter 410, a transmission gate 422, an inverter 423 that is part of a latch, and another inverter 425. Another arrow indicates a distance of a second signal path and components in the second signal path responsible for at $t_{launch}$ delay.

The known MSFF 400 includes a test control stage 401, a master stage 402 and a slave stage 403. The test control stage 401 includes an input terminal coupled to the input terminal 404 of the known MSFF 400 for receiving input data $D_{in}$, the TI terminal 405 for receiving a TI signal, an input terminal for receiving a test enable (TE) signal, and an output terminal. The master stage 402 includes an input terminal connected to the output terminal of the test control stage 401, an input terminal for receiving CLK, an input terminal for receiving CLKB, and an output terminal. The slave stage 403 includes an input terminal connected to the output terminal of the master stage 402, an input terminal for receiving CLK, and an output terminal connected to an output terminal 409 of the known MSFF 400 for outputting data out $D_{out}$.

The test control stage 401 further includes tri-state inverters 410 and 411. The tri-state inverter 410 includes a control terminal for receiving TE, another control terminal for receiving TEB, an input terminal connected to the input terminal 404 of the known MSFF 400, and an output terminal. The tri-state inverter 411 includes a control terminal for receiving TE, another control terminal for receiving TEB, an input for receiving TI, and an output terminal. The output terminals of the tri-state inverters 410 and 411 are connected to a common node that provides an output terminal of the test control stage 401.

The master stage 402 further includes the transmission gate 422, inverters 423 and 425, and a tri-state inverter 424. The transmission gate 422 includes a first terminal connected to the output terminal of the test control stage 401, a second terminal, a control terminal to receive CLK and another control terminal to receive CLKB. The inverter 423 includes an input terminal connected to the second terminal of the transmission gate 422, and an output terminal. The tri-state inverter 424 includes an input terminal connected to the output of the inverter 423, an output terminal connected to the input terminal of the inverter 423, a control input for receiving CLK and another control terminal for receiving CLKB. The inverter 425 includes an input terminal connected to the output terminal of the inverter 423 and an output terminal that provides an output terminal of the master stage 402.

The slave stage 403 further includes a launch transmission gate 436, inverters 437 and 438, and a tri-state inverter 439. The launch transmission gate 436 includes a first terminal connected to the output terminal of the master stage, a second terminal, a control terminal for receiving CLK and another control terminal for receiving CLKB. The inverter 438 includes an input terminal connected to the second terminal of the launch transmission gate 436, and an output terminal. The tri-state inverter 439 includes an input terminal connected to the output terminal of the inverter 438, an output connected to the input of the inverter 438, a control terminal for receiving CLK and another control terminal for receiving CLKB. The inverter 437 includes an input terminal connected to the second terminal of the launch transmission gate 436 and an output terminal connected to the output terminal 409 of the known MSFF 400 for outputting $D_{out}$.

FIG. 5 is a schematic of one embodiment of the PMSFF 500. The arrow indicates a distance of a parallel signal path and indicates a single component in the parallel signal path responsible for the $t_{setup2}$ delay in accordance with the invention. The single component is a NAND gate 525. Another arrow indicates a distance of a second signal path and components in the second signal path responsible for a $t_{launch}$ delay.

The embodiment of the PMSFF 500 shown in FIG. 5 includes the test control stage 501. The test control stage 501 of the PMSFF 500 includes an input terminal coupled to an input terminal 504 of the PMSFF for receiving input data $D_{in}$, such as $D_{in0}$ shown in FIGS. 1 and 2, a TI terminal 505 for receiving the TI signal, an input terminal for receiving TE, and an output terminal. The master 502 of the PMSFF 500 includes an input terminal coupled to the output terminal of the test control stage 501, an input terminal for receiving CLK, an input terminal for receiving CLKB, and an output terminal. The slave 503 of the PMSFF 500 includes an input terminal coupled to the output terminal of the master 502, an input terminal for receiving CLK, and an output terminal coupled to an output terminal 509 of the PMSFF 500.

The test control stage 501 further includes tri-state inverters 510 and 511. The tri-state inverter 510 includes a control terminal for receiving TE, another control terminal for receiving TEB, an input terminal coupled to the input terminal 504 of the PMSFF, and an output terminal. The tri-state inverter 511 includes a control terminal for receiving TE, another control terminal for receiving TEB, an input for receiving TI, and an output terminal. The output terminals of the tri-state inverters 510 and 511 are coupled to a common node that provides an output terminal of the test control stage 501.

Another embodiment (not shown) of the PMSFF 500 that lacks the test control stage 501 is foreseeable. In such other embodiment, an input terminal of the master 502 of the PMSFF 500 provides the input terminal 504 of the PMSFF for receiving the input data $D_{in}$.

The master 502 further includes a transmission gate 522, an inverter 523, a tri-state inverter 524, and the NAND gate 525. The transmission gate 522 includes a first terminal coupled to the output terminal of the test control stage 501, a second terminal, a control terminal to receive MCLK and another control terminal to receive MCLKB. A delay element 526 delays CLK by the amount of time $t_{delay}$, as shown in FIG. 3, to produce MCLK. The inverter 523 includes an input terminal coupled to the second terminal of the transmission gate 522, and an output terminal. The tri-state inverter 524 includes an input terminal coupled to the output terminal of the inverter 523, an output terminal coupled to the input terminal of the inverter 523, a control input for receiving MCLK and another control terminal for receiving MCLKB. The inverter 523 and the tri-state inverter 524 constitute a storage element 520. In another embodiment (not shown), the storage element 520 comprises other elements. The NAND gate 525 includes a first input terminal 541 coupled to the output terminal of the inverter 523 and a parallel input terminal 542 coupled to the input terminal 504 of the PMSFF 500 via a conductor 546, and an output terminal 543 that provides an output terminal of the master 502.

The slave 503 further includes a launch transmission gate 536, output inverter 537, inverter 538, and a tri-state inverter 539. The launch transmission gate 536 includes a first terminal coupled to the output terminal of the master 502, a second terminal, a control terminal for receiving CLK and another control terminal for receiving CLKB. The inverter 538 includes an input terminal coupled to the second terminal of the launch transmission gate 536, and an output terminal. The tri-state inverter 539 includes an input terminal coupled to the output terminal of the inverter 538, an output coupled to the input of the inverter 538, a control terminal for receiving CLK and another control terminal for receiving CLKB. The inverter 538 and the tri-state inverter 539 constitute another storage element 530. The output inverter 537 includes an input terminal coupled to the second terminal of the launch transmission gate 536 and an output terminal coupled to the output terminal 509 of the PMSFF 500 for outputting $D_{out}$.

$D_{in}$ is coupled to one of SBL and SBLB. In the illustrated embodiment, it is assumed that $D_{in}$ is coupled to SBL. In another embodiment (not shown) of coupling between the sense amplifier and the PMSFF 500, $D_{in}$ can be coupled to SBLB. $D_{in}$ either stays high which indicates that a first logical state is stored in the selected bitcell 206 or goes low which indicates that a second logical state is stored in the selected bitcell.

$D_{in}$ is a dynamic signal that makes only one transition during an evaluation phase. In general, $D_{in}$ can either go from high to low or from low to high. For the PMSFF 500, $D_{in}$ goes from high to low during the evaluation phase. In another embodiment of the PMSFF (not shown) that includes a NOR gate instead of the NAND gate 525, $D_{in}$ goes from low to high during the evaluation phase. Such other embodiment of the PMSFF that includes the NOR gate is logically equivalent to the PMSFF 500. If SBL and SBLB are precharged low, then, during evaluation, one of them will go high. When CLK is high, i.e., when not in the evaluation phase, $D_{in}$ is in a known state. Being in a known state means that $D_{in}$ is either precharged high or precharged low. When the known state is high, as with the illustrated embodiment, $D_{in}$ is high when not evaluating $D_{in}$. When the known state is low, the other embodiment of the PMSFF (not shown) that includes the NOR gate is used, and is $D_{in}$ is low when not evaluating $D_{in}$.

Figure 6:
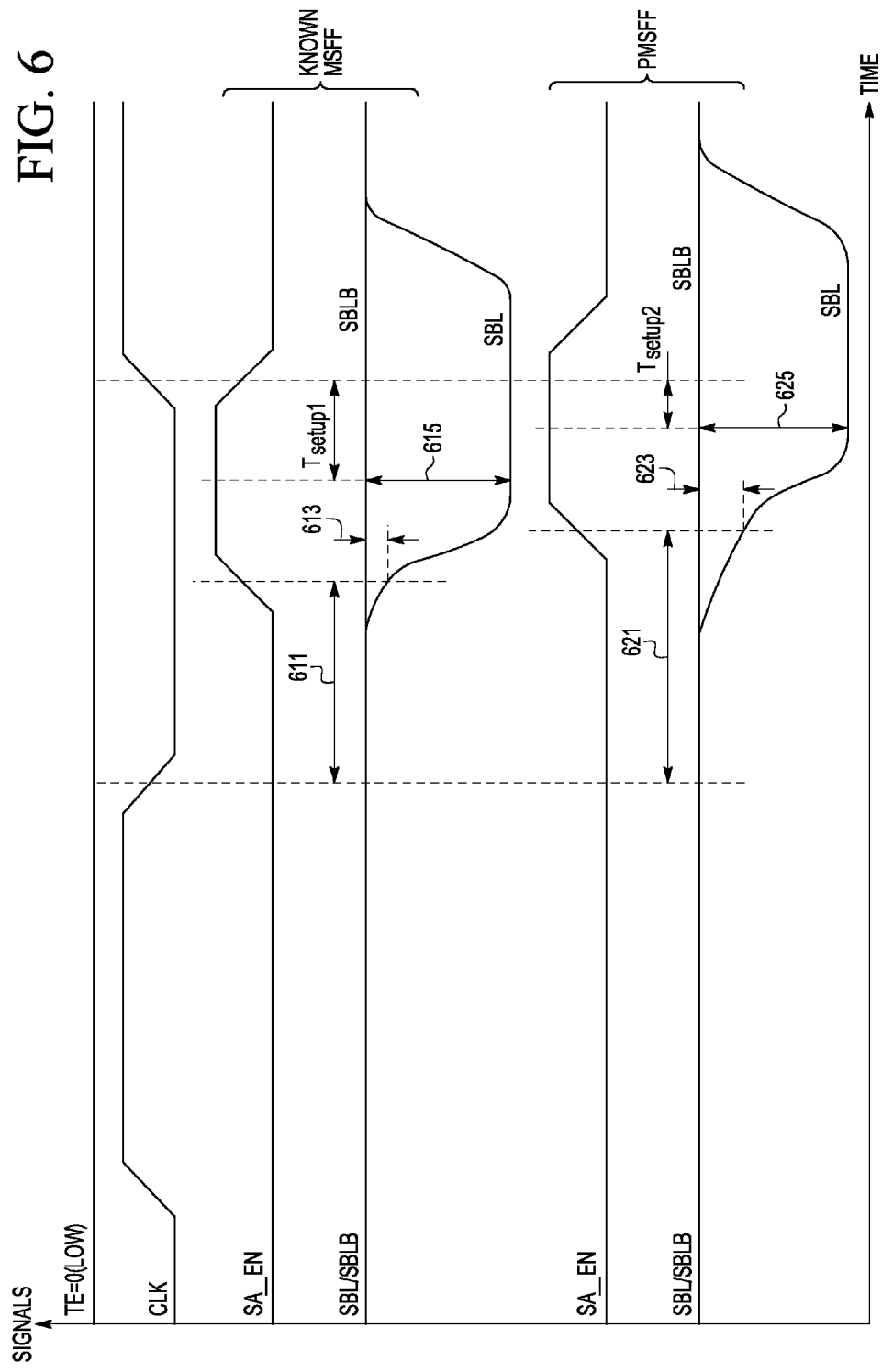
FIG. 6 is a timing diagram of signals in the known MSFF of FIG. 4, and corresponding signals in the parallel MSFF of FIG. 1.

FIG. 6 is a timing diagram of signals in the known sense amplifier and the known MSFF 400 (see middle portion of FIG. 6), and corresponding signals in the improved sense amplifier 204 and the PMSFF 500 (see lower portion of FIG. 6). The timing diagram FIG. 6 assumes that the known MSFF 400 is coupled to a known sense amplifier and that the PMSFF 500 is coupled to the improved sense amplifier 204.

The upper portion of FIG. 6 shows TE=0, which means that the known MSFF 400 and the PMSFF 500 are in normal mode. The upper portion of FIG. 6 also shows the CLK signal.

The middle portion of FIG. 6 shows a differential development time 611 for a known sense amplifier. FIG. 6 also shows, for the known sense amplifier, at a moment that the SA_EN signal is asserted, that a selected bitcell has developed an intermediate differential voltage 613 between BL and BLB. FIG. 6 further shows that the known sense amplifier generates a differential voltage 615 between SBL and SBLB, which is an amplification of the intermediate differential voltage 613. The differential voltage 615 outputted by the known sense amplifier is a difference between two voltages: $V_{DD}$ and $V_{SS}$, which can correspond to logical high and logical low, respectively. FIG. 6 also shows the $t_{setup1}$ delay.

The lower portion of FIG. 6 shows that, in the improved sense amplifier 204, the SA_EN signal is turned on later in a clock cycle in relation to when an SA_EN signal is turned on in a known sense amplifier. This allows an initial shallow slope of a graph of SBL or SBLB to persist for more time. With the improved sense amplifier 204, a longer differential development time 621 results. FIG. 6 shows, for the improved sense amplifier 204, that the selected bitcell 206 has developed an intermediate differential voltage 623 between BL and BLB by the time that the SA_EN signal is asserted. The intermediate differential voltage 623 developed by the bitcell 206 of the improved sense amplifier 204 is advantageously larger than the intermediate differential voltage 613 developed by a bitcell of the known sense amplifier. In one embodiment, the intermediate differential voltage 623 developed by the bitcell 206 of the improved sense amplifier 204 is about fifteen (15%) percent larger than the intermediate differential voltage 613 developed by a bitcell of the known sense amplifier. FIG. 6 also shows that the improved sense amplifier 204 generates a differential voltage 625 between SBL and SBLB, which is an amplification of the intermediate differential voltage 623. The differential voltage 625 outputted by the improved sense amplifier 204 is the difference between two voltages: $V_{DD}$ and $V_{SS}$, which can correspond to logical high and logical low, respectively. In addition, FIG. 6 shows that the $t_{setup2}$ delay is advantageously shorter than the $t_{setup1}$ delay. The differential voltage $DV_2$ of the improved sense amplifier 204 can be calculated as follows:

$$DV_2 = (t_{setup1} - t_{setup2}) \times mV/\rho s + DV_1,$$

where $DV_1$ is the differential voltage of the known sense amplifier.

The output node of the improved sense amplifier 204 is coupled to the input terminal 504 of the PMSFF 500. In general, data input $D_{in}$ to the PMSFF 500 occurs at a transition of an output node of the improved sense amplifier 204. In the illustrated embodiment, $D_{in}$ occurs at a falling edge of an output node of the improved sense amplifier 204. A falling edge of the output node of the improved sense amplifier 204 is a critical edge of output data of the SRAM 202. A rising edge of the output node of the improved sense amplifier 204 is controlled by a sense precharge signal which occurs much earlier in time. The illustrated embodiment of the PMSFF 500 assumes that SBL and SBLB are precharged high, and, therefore, the critical edge of $D_{in}$ is a low-going edge. The other embodiment (not shown) of the PMSFF 500 is used when SBL and SBLB are precharged low, and, in such other embodiment, the critical edge of $D_{in}$ is a high-going edge.

To reduce the setup time, the PMSFF 500 allows $D_{in}$ to bypass the master 502 and set up directly to the launch transmission gate 536 in the slave 503. In other words, the PMSFF 500 includes a dynamic master 502 and a static slave 503. A sum of setup time and hold time is almost constant; therefore, reducing the setup time increases the hold time. Because precharge controls the falling edge, i.e., the hold time, the precharge condition can be changed without significant impact. The PMSFF 500 works in cooperation with a delayed precharge condition in the improved sense amplifier 204 for hold time extension. The amount by which the setup time of the PMSFF 500 is reduced is equal to or greater than the amount by which the differential development time of the improved sense amplifier 204 is increased. The precharge condition in the improved sense amplifier 204 is triggered by the SPCH signal. The setup time of the PMSFF 500 does not affect a clock-to-Q launch delay of the PMSFF.

To reduce the setup time, the $D_{in}$ signal bypasses the master 502 and provides $D_{in}$ almost directly to the slave 503 for launching $D_{out}$ when CLK transitions high. The only delay is attributable to the NAND gate 525. Therefore, MCLK needs to wait until $D_{in}$ is latched by the master 502. A rising edge of MCLKB for the master is delayed by the amount $t_{delay}$ such that it occurs after $D_{in}$ is present at the input terminal of tri-state inverter 524.

Although $D_{in}$ appears at the output of the master of the PMSFF 500 more quickly than it would do so in a known MSFF, it nevertheless remains necessary to retain the value of $D_{in}$ in the storage element 520 of the master for a complete cycle of CLK. It is necessary that the value of $D_{in}$ be retained in the storage element 520 of the master for a next phase (the isolation phase) so that the slave can launch on a rising edge of CLK.

FIG. 7 shows the condition of the circuitry of the PMSFF 500 in normal mode (TE=0) and when CLK is low. FIG. 7 also assumes that MCLK is low. When CLK is low, the PMSFF 500 is in the evaluation phase. When MCLK is low, the master 502 is transparent and $D_{out}$ is provided by the slave 503. The PMSFF 500 splits a data-in path into two separate paths: a first path 701 that goes through the tri-state inverter 510, the transmission gate 522, and the inverter 523 before reaching the NAND gate 525, and a second, parallel path 702 that goes directly to the NAND gate. The first path 701 is slow; the first path is used for latch and scan mode operation of the master 502. The parallel path 702 has a minimum delay; the parallel path is used to reduce the setup time. A known MSFF may include the first path 701 but disadvantageously lacks the parallel path 702. With the PMSFF 500, $D_{in}$ is allowed to occur late (compared to an occurrence time of $D_{in}$ in a circuit that includes a known sense amplifier and a known MSFF). It should be noted that the PMSFF 500 also functions properly when $D_{in}$ does not occur late. The fast parallel path 702 allows $D_{in}$ to bypass the slow first path 701, so that a late-arriving $D_{in}$ does not affect the time that $D_{out}$ appears at the output node of the master 502.

When CLK is low, the launch transmission gate 536 is turned off and is open, the slave 503 is uncoupled from the master 502, and a value outputted by the PMSFF 500 at $D_{out}$ is the value that is latched, or stored, in the slave 503. This is illustrated by path 703. In the following explanation, assume that a value is stored in the slave 503 is high.

With the PMSFF 500, $D_{in}$ can bypass the first path 701 and go (via the parallel path 702) directly to a parallel input terminal 542 of the NAND gate 525. $D_{in}$ via the parallel path 702 arrives at the NAND gate 525 before $D_{in}$ via the first path 701 arrives at the NAND gate. At a moment of a low-going transition of the CLK, a value of a first input of the NAND gate 525 is irrelevant because, when the value of the parallel input goes low, an output of the NAND gate 525 responds by going high. This is how the setup time is sped up. However, it is necessary to wait for $D_{in}$ through the first path 701 to arrive at the first input terminal 541 of the NAND gate 525 before the transmission gate 522 in the master 502 turns off and opens. This is accomplished by the delaying of MCLK relative to CLK by the amount of time $t_{delay}$. After $D_{in}$ through the first path 701 finally arrives at NAND gate 525, both inputs to the NAND gate become low, and the output terminal 543 of the NAND gate remains high. Later still, when $D_{in}$ precharges high, the parallel input of NAND gate 525 becomes high, but the first input remains low, so the output of the NAND gate maintains its value of high.

The PMSFF 500 allows the falling edge of $D_{in}$ to propagate very fast to the parallel input terminal 542 of the NAND gate 525, so that the output of the NAND gate is established when the rising edge of the CLK occurs, so that the clock-to-Q delay is not affected. The MCLK is delayed because there is a need to delay occurrence of a falling edge of MCLKB. A falling edge of MCLKB is delayed by the amount of time $t_{delay}$ to allow a late-arriving $D_{in}$ to be captured by the master 502. The delay in occurrence of the falling edge of MCLKB allows $D_{in}$ time to propagate through the first, relatively slow, path and reach the NAND gate 525. Then, a falling edge of MCLKB occurs, which causes the transmission gate 522 in the master 502 to turn off and become open. As a result of the opening of the transmission gate 522, the value of $D_{in}$ which arrived late through the first path 701, is latched, i.e., held, in the master 502. Thereafter, another falling edge of PCH_B precharges BL and BLB high, and $D_{in}$ goes high again, and the process continues. As explained elsewhere herein, the PMSFF 500 has a normal mode and a test mode. The foregoing explanation is applicable to the normal mode.

FIG. 8 shows the condition of the circuitry of the PMSFF 500 in normal mode (TE=0) and when CLK is high. FIG. 8 also assumes that MCLK is high. When CLK is high, the PMSFF 500 is in the precharge phase. When CLK is high, the master 502 provides $D_{out}$ and the slave 503 is transparent. $D_{out}$ launches when CLK goes high. When CLK goes high, the launch transmission gate 536 in the slave 503 is turned on and is closed, and data at the output of the NAND gate 525, which is the data stored in the master 502, goes out of the $D_{out}$ node of the PMSFF 500 after a clock-to-Q launch delay. This illustrated by path 801. The setup time of the PMSFF 500 is reduced by delaying the MCLK, i.e., delaying when the MCLKB goes low which turns off and opens the transmission gate in the master 502. Therefore, the setup time of the PMSFF 500 is reduced by the amount of time that MCLK is delayed with respect to CLK. If the amount of the delay of the MCLK is too much, the clock-to-$D_{out}$ launch delay could be affected; therefore, the amount that the MCLK is delayed is selected to be as large as possible such that the clock-to-$D_{out}$ launch delay advantageously remains unaffected.

Referring now to FIGS. 7 and 8, in the evaluation phase of the PMSFF 500, $D_{in}$ is evaluated for a low-going signal. The evaluated $D_{in}$ is held in the master 502 for the precharge phase of the PMSFF 500. $D_{in}$ goes through the parallel path quicker than through the first path. Therefore, once the low-going $D_{in}$ propagates through the fast parallel path, it can launch, as $D_{out}$ from the PMSFF 500, at a next rising edge of the CLK. The low $D_{in}$ at the parallel input terminal 542 of the NAND gate 525 causes the output of the NAND gate to be high because the first input of the NAND gate is high. The first input terminal 541 of NAND gate 525 is high because it is assumed in this explanation that the value latched in the storage element 520 of the master 502 is high. Also, when the CLK is high: 1) the launch transmission gate 536 of the slave 503 is turned on and is closed, therefore the output of the NAND gate 525 is coupled to the output inverter; 2) the slave 503 is transparent because tri-state inverter 539 in the storage element 530 of the slave is turned off and is open; and 3) $D_{out}$ of the PMSFF 500 is low because the output of the NAND gate is high. In other words, when CLK goes high, the output of the NAND gate 525 is coupled to $D_{out}$ through the output inverter 537, and $D_{out}$ launches. A low $D_{out}$ reflects the fact that $D_{in}$ was low. The late arriving $D_{in}$, which is due to the slow first path, is captured, stored, held and latched in the master 502.

At a later time, MCLK goes high and MCLKB goes low, the transmission gate in the master 502 is turned off and becomes open, and the first input of the NAND gate 525 receives only the stored value of $D_{in}$.

When the CLK goes high, the master 502 stops sampling $D_{in}$ and holds the last sampled $D_{in}$ while providing a value of the last sampled $D_{in}$ to the slave 503. After CLK goes high, MCLK goes high (after the delay). MCLK going high turns off and opens the transmission gate 522 in the master 502, and turns on and closes the tri-state inverter 524 in the master. When MCLK is high, $D_{in}$ has only one path, $D_{in}$ is coupled to only one input (the parallel input terminal 542) of the NAND gate 525, and the value of $D_{in}$ is stored in the master 502. Afterward, in a next cycle, when the parallel input to the NAND gate 525 goes high (because of the precharging of $D_{in}$ high at every cycle), the value that the master 502 is storing remains unchanged, i.e., low. Consequently, with the PMSFF 500, the output of the NAND gate 525 can launch at the next rising edge of CLK notwithstanding the late arrival of the low-going $D_{in}$ at the first input terminal 541 of the NAND gate.

A goal of the PMSFF 500 is that the clock-to-$D_{out}$ delay be unaffected, i.e., to not increase. Setup time of the PMSFF 500 is determined by how late $D_{in}$ can be delayed and still not affect a clock-to-$D_{out}$ delay. The setup time is defined how close in time the occurrence of a change in the output of the NAND gate 525 can come to the occurrence of the rising edge of CLK, without affecting the clock-to-$D_{out}$ delay. Setup time is selected such that when CLK goes high (which causes a new data launching), the clock-to-$D_{out}$ delay is the same as if the arrival time of $D_{in}$ was not late.

In the illustrated embodiment, the setup time of $D_{in}$ is a defined interval of time prior to a rising edge of CLK. The output of the master 502 must be established at or before the rising edge of CLK. This is to make sure there is no effect on a clock-to-$D_{out}$ launch delay. Of course, with the PMSFF 500, the "output of the master 502" is synonymous with the output terminal 543 of the NAND gate 525. To meet a setup time requirement, $D_{in}$ is required to arrive at the input of the PMSFF 500 before a start of the setup time interval. Of course, "the input of the PMSFF 500" is synonymous with the parallel input terminal 542 of the NAND gate 525.

The clock-to-$D_{out}$ launch delay is an interval required for the launch transmission gate 536 in the slave 503 to open plus a duration of a propagation delay through the output inverter 537. The setup for the PMSFF 500 is advantageously shorter than the setup time for the known MSFF 400 because the known MSFF has a greater number of gate delays between input terminal 504 of the master 502 and the launch transmission gate 536 in the slave 503.

Because setup time of the PMSFF 500 is reduced, the SA_EN of the improved sense amplifier 204 that is coupled to the PMSFF can be turned on later compared to a turn-on time of a known sense amplifier coupled to a known MSFF. The PMSFF 500 allows for a delay in the firing of the SA_EN signal so that, when it is fired, there is more differential voltage between SBL and SBLB. A later turning on of the SA_EN signal advantageously results in more differential voltage between SBL and SBLB.

Figure 9:
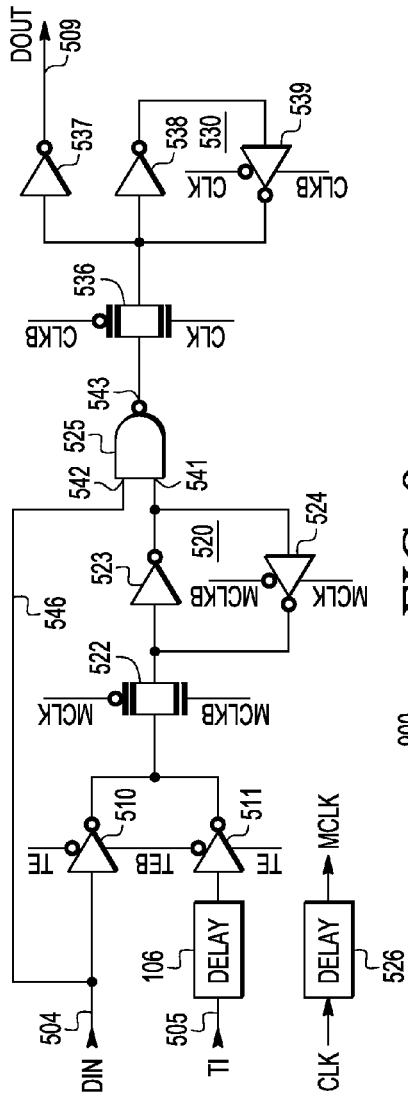
FIG. 9 is a schematic of a first embodiment of the parallel MSFF of FIG. 1 in test mode.
Figure 10:
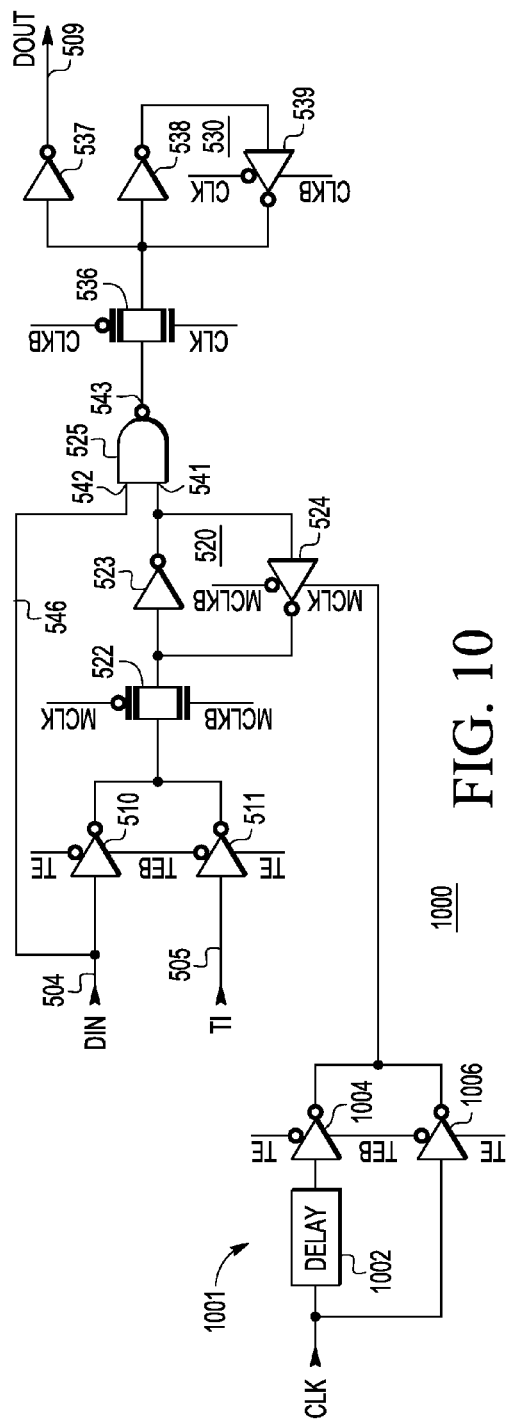
FIG. 10 is a schematic of a second embodiment of the parallel MSFF of FIG. 1 in test mode.

Referring now to FIGS. 9 and 10. During test mode, more than one PMSFF 500 are connected in serial chain fashion, i.e., a $D_{out}$ terminal is connected to a TI terminal of a next PMSFF, and so on, as indicated by the line from $SDOUT_0$ to $SDOUT_{m-1}$ in FIG. 1.

In normal operation, TE is low, i.e., TE=0. In test mode, TE is high, i.e., TE=1. The test mode is useful when it is desired that the parallel input of the NAND gate 525 stay high. It is only when the parallel input of the NAND gate 525 is high that the value of a TI signal can propagate to the output of the PMSFF 500. If the parallel input of the NAND gate 525 is low, the output of the NAND gate stay high, $D_{out}$ stays low, and the TI value does not propagate to the $D_{out}$ terminal.

The PMSFF 500 requires $D_{in}$ to be high (low for the other embodiment having a NOR gate instead of the NAND gate 525) when PMSFF provides data to the output. This is guaranteed by a dynamic nature of the $D_{in}$ signal. In test mode, the PMSFF 500 requires $D_{in}$ to stay high, so that TI can propagate to the output. This requirement is met by controlling a state of the SRAM 202 during test mode. Test mode is used to scan-in and scan-out data of the PMSFF 500 to test and validate logic located downstream from the PMSFF. The logical guarantee is provided by controlling a state of the TE signal with control logic (not shown) of the SRAM 202. When TE is high, the SRAM 202 is disabled and the SPCH_B signal stays low, thereby logically guaranteeing that $D_{in}$ is high.

The SRAM 202 is not used in test mode. In test mode, it is not the SRAM 202 that is being tested, nor is it the PMSFF 500 that is being tested. Rather, in test mode, it is logic that is downstream from the PMSFF that is being tested. In test mode, a known value of $D_{in}$ is inputted into the PMSFF 500 so that the logic that is downstream from the PMSFF can be tested. During test mode, the SRAM 202 can be disconnected from the PMSFF 500; provided that $D_{in}$ is kept in a constant high state (or in a constant low state for the other embodiment of the PMSFF with a NOR gate).

FIG. 9 is a schematic of a first embodiment 900 of the PMSFF 500 in test mode (TE=1). The first embodiment 900 of the PMSFF 500 in test mode includes the delay element 106 coupled between the test-input terminal of the PMSFF and the input terminal of the test control stage 501, wherein the delay element delays the test-input signal by the amount of time $t_{delay}$. For the first embodiment, during test mode, the TI path is delayed because if the TI signal were not delayed, a hold time violation may occur with the TI signal during scan. The amount of time that delay element 106 delays the TI signal is equal to the amount of time that delay element 301 delays the CLK signal. MCLK is delayed to allow the $D_{in}$ signal to be captured at the master 502. During test mode, MCLK would cause a hold violation; new data launched by a previous PMSFF 500 in the chain would corrupt data in a current PMSFF. The delay of the delay element 106 is matched to the delay of MCLK relative to CLK to meet a hold timing requirement during operation of the PMSFF 500 in test mode.

FIG. 10 is a schematic of a second embodiment 1000 of the PMSFF 500 in test mode (TE=1). With the second embodiment of the PMSFF 500 in test mode, a behavior of MCLK is changed between normal mode and test mode. Instead of adding the delay to TI (as in the first embodiment), in the second embodiment, the delay is not added to MCLK. In the second embodiment, the TE signal controls the behavior of MCLK, such that, when in the PMSFF 500 is in test mode, MCLK is not delayed. The second embodiment 1000 of the PMSFF 500 in test mode includes additional circuitry 1001 for changing the behavior of MCLK depending on a value of TE. The additional circuitry 1001 includes a delay element 1002, a first tri-state inverter 1004 and a second tri-state inverter 1006. To comply with the hold timing requirement during test mode operation, the delay of the delay element 1002 is matched to the delay of MCLK relative to CLK. Provided that $D_{out}$ when connected to TI meets the hold time, a delay may not be needed, but the delay is usually added nevertheless.

For both the first and second embodiments of the PMSFF 500 in test mode, as CLK toggles, none of the signals of the improved sense amplifier 204 toggle; such signals are all disabled (some remain high; others remain low). SPCH_B stays low. During test mode, the SBL remains high at all times during test mode. TE disables access to the SRAM 202 by SA_EN staying low, and by PCH_B and SPCH_B staying low. Therefore, if the SA_EN does not go high, it will not fire the improved sense amplifier 204.

The PMSFF 500 improves reliability of the SRAM 202 due to increased differential voltage of the improved sense amplifier 204. Advantageously, the PMSFF 500 does not affect the clock-to-$Q_{out}$ launch delay.

Advantageously, with the PMSFF 500, there is no time borrowing or cycle stealing from a downstream path, and there is no softening of clock edges. With the PMSFF 500, there is no flushing of $D_{in}$ to Q. $D_{in}$ is setup with respect a rising edge of CLK for a constant clock-to-$Q_{out}$ launch delay. A reduced setup time of the PMSFF 500 allows the improved sense amplifier 204 to develop a differential voltage with an extra margin.

The PMSFF 500 allows an SRAM 202 more time to perform a read operation. The PMSFF 500 allows a slower SRAM 202 to operate at a frequency normally useable only by a faster SRAM. For a given SRAM 202, the PMSFF 500 allows a cycle period to be reduced. In one embodiment, the PMSFF 500 allows the cycle period to be reduced by about ten (10%) percent.

For a given bitcell 206, the improved sense amplifier 204 advantageously senses more intermediate differential voltage outputted by the bitcell 206.

For a given differential voltage, the improved sense amplifier 204 allows the use of a smaller bitcell 206. Such smaller bitcell 206 advantageous consumes less power.

A combination of the improved sense amplifier 204 and the PMSFF 500 allows weaker bits to meet a timing requirement without a need to slow the access speed, i.e., yield improvement.

With the improved sense amplifier 204 and the PMSFF 500, a smaller bitcell 206 could be potentially used with a same timing as normally used with a larger bitcell.

In one embodiment, the PMSFF 500, which has an input terminal 504 for receiving a data-in signal and an output terminal 509 for outputting a data-out signal, comprises: the master stage 502 that includes an input terminal for receiving the data-in signal, an output terminal, and terminals for receiving first clock signals (MCLK and MCLKB). The master stage is configured to latch data at the master stage and to output the data latched at the master stage based on the first clock signals. The master stage includes: the transmission gate 522 that is coupled to the input terminal of the master stage, wherein the transmission gate has a control terminal to receive MCLK, another control terminal to receive MCLKB, and an output terminal; the storage element 520 that is coupled to the output terminal of the transmission gate 522, wherein the storage element either latches the data-in signal or is transparent, depending on MCLK and MCLKB; and a two-input logic gate that has a first input terminal coupled to the storage element, a parallel input terminal coupled to the input terminal of the master stage, and an output terminal that provides an output terminal of the master stage. The PMSFF also comprises the slave stage 503 that includes an input terminal that is coupled to the output terminal of the master stage, an output terminal for outputting the data-out signal, and terminals for receiving second clock signals (CLK and CLKB). The slave stage is configured to latch data at the slave stage and to output the data latched at the slave stage based on the second clock signals.

In another embodiment, a circuit comprises: the dynamic circuit module 102 that has at least one output terminal for outputting dynamic digital data based on the clock signal (CLK), and the PMSFF 500 that has an input terminal for receiving the dynamic digital data and an output terminal for outputting a data-out signal. The PMSFF comprises: the master stage 502 that includes an input terminal for receiving the dynamic digital data, an output terminal, and terminals for receiving first clock signals (MCLK and MCLKB). The master stage is configured to latch data at the master stage and to output the data latched at the master stage based on the first clock signals. The master stage further includes: the transmission gate 522 coupled to the input terminal of the master stage, wherein the transmission gate has a control terminal to receive MCLK, another control terminal to receive MCLKB, and an output terminal; the storage element 520 coupled to the output terminal of the transmission gate; and the NAND gate 525 that has a first input terminal coupled to the storage element, a parallel input terminal coupled to the input terminal of the master stage, and an output terminal that provides an output terminal of the master stage. The PMSFF also comprises the slave stage 503 that includes an input terminal coupled to the output terminal of the master stage, an output terminal for outputting the data-out signal, and terminals for receiving second clock signals (CLK and CLKB). The slave stage is configured to latch data at the slave stage and to output the data latched at the slave stage based on the second clock signals.

In yet another embodiment, the memory system 100 comprises: the static random access memory 202 that includes the bitcell 206 that has terminals for outputting an intermediate differential voltage when the bitcell is accessed and that has the differential development time 621 for developing the intermediate differential voltage 623; the improved sense amplifier 204 for receiving the intermediate differential voltage 623 and for outputting the differential voltage 625; and the PMSFF 500 that has the input terminal 504 for receiving the differential voltage 625 and the output terminal 509 for outputting a data-out signal. The PMSFF includes: the master stage 502 that includes an input terminal for receiving the differential voltage, an output terminal, and terminals for receiving first clock signals (MCLK and MCLKB). The master stage is configured to latch data at the master stage and to output the data latched at the master stage based on the first clock signals. The master stage has the setup time ($T_{setup2}$). The master stage further includes: the transmission gate 522 coupled to the input terminal of the master stage, wherein the transmission gate has a control terminal to receive MCLK, another control terminal to receive MCLKB, and an output terminal; the storage element 520 coupled to the output terminal of the transmission gate 522, wherein the storage element either latches the differential voltage or is transparent, depending on MCLK and MCLKB; and the two-input logic gate having a first input terminal coupled to the storage element, a parallel input terminal coupled to the input terminal of the master stage, and an output terminal that provides an output terminal of the master stage. The PMSFF also includes the slave stage 503 that comprises an input terminal coupled to the output terminal of the master stage, an output terminal for outputting the data-out signal, and terminals for receiving second clock signals (CLK and CLKB). The slave stage is configured to latch data at the slave stage and to output the data latched at the slave stage based on the second clock signals.

In another embodiment (not shown), when complimentary data is desired, in addition to the input terminal 504 of one PMSFF 500 being coupled to the SBL output node of the improved sense amplifier 204, an input terminal 504 of another PMSFF 500 is coupled to the SBLB output node of the same improved sense amplifier.

In another embodiment (not shown), the PMSFF 500 is coupled to the output of a known sense amplifier with additional logic circuitry inserted between the output terminal of the known sense amplifier and the input terminal of the PMSFF. In such case, the reduced setup time of the PMSFF 500 advantageously avoids any problem caused by the propagation delay caused by such additional logic circuitry.

The improved sense amplifier 204 and the PMSFF 500 are not limited to use with only an SRAM. The improved sense amplifier 204 and the PMSFF 500 can be used with other types of memory.

In another embodiment (not shown), a dynamic bus of a DDR5 memory includes the PMSFF 500, wherein the PMSFF is used for driving a bus line.

In some embodiments, the components of the PMSFF 500 may be fabricated using complementary metal-oxide-semiconductor (CMOS) technology.

Although the invention has been described with respect to specific conductivity types or polarity of potentials, skilled artisans appreciated that conductivity types and polarities of potentials may be reversed.

Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled. Moreover, the terms "front", "back", "top", "bottom", "over", "under", and the like, in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims.

The Detailed Description section, and not the Abstract section, is intended to be used to interpret the claims. The Abstract section may set forth one or more but not all embodiments of the invention, and the Abstract section is not intended to limit the invention or the claims in any way.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages or solutions to problems that are described herein with regard to specific embodiments are not intended to be construed as a critical, required, or essential feature or element of any or all the claims.

What is claimed is:

1. A parallel master-slave flip-flop ("PMSFF") having an input terminal for receiving a data-in signal and an output terminal for outputting a data-out signal, comprising:

a master stage comprising an input terminal for receiving the data-in signal, an output terminal, and terminals for receiving first clock signals (MCLK and MCLKB), the master stage configured to latch data at the master stage and to output the data latched at the master stage based on the first clock signals, wherein the master stage includes:

a transmission gate coupled to the input terminal of the master stage, the transmission gate having a control terminal to receive MCLK, another control terminal to receive MCLKB, and an output terminal, a storage element coupled to the output terminal of the transmission gate, wherein the storage element either latches the data-in signal or is transparent, depending on MCLK and MCLKB, and a two-input logic gate having a first input terminal coupled to the storage element, a parallel input terminal coupled to the input terminal of the master stage, and an output terminal that provides an output terminal of the master stage; and a slave stage comprising an input terminal coupled to the output terminal of the master stage, an output terminal for outputting the data-out signal, and terminals for receiving second clock signals (CLK and CLKB), the slave stage configured to latch data at the slave stage and to output the data latched at the slave stage based on the second clock signals.

2. The PMSFF of claim 1, wherein the first clock signals are delayed relative to corresponding second clock signals by a delay element by an amount of time $t_{delay}$.

3. The PMSFF of claim 1, wherein the data-in signal is in a stable high state, when the master stage of the PMSFF is non-transparent.

4. The PMSFF of claim 3, wherein the two-input logic gate is a NAND gate.

5. The PMSFF of claim 1, wherein the data-in signal is in a stable low state, when the master stage of the PMSFF is non-transparent.

6. The PMSFF of claim 5, wherein the two-input logic gate is a NOR gate.

7. The PMSFF of claim 1, wherein the storage element includes
an inverter having an input terminal coupled to the transmission gate, and an output terminal, and
a tri-state inverter having an input terminal coupled to the output terminal of the inverter, an output terminal coupled to the input terminal of the inverter, a control input for receiving MCLK and another control terminal for receiving MCLKB.

8. The PMSFF of claim 7, wherein the first clock signals are delayed relative to corresponding second clock signals by an amount of time $t_{delay}$ where $t_{delay}$ is substantially equal to a propagation delay through the transmission gate plus a propagation delay through the inverter of the storage element of the master stage.

9. The PMSFF of claim 1, further comprising:
a test control stage including:
an input terminal coupled to the input terminal of the PMSFF,
a test-input terminal for receiving a test-input signal, wherein the test-input terminal of the test control stage provides a test-input terminal of the PMSFF,
terminals for receiving test-enable signals (TE and TEB), and
an output terminal coupled to the input terminal of the master stage,
wherein the master stage receives one of the data-in signal and the test-input signal, based on values of the test enable signals.

10. The PMSFF of claim 9, wherein the test control stage further includes:
a first tri-state inverter having an input terminal coupled to the input terminal of the test control stage, a control terminal for receiving TE, another control terminal for receiving TEB, and an output terminal,
a second tri-state inverter having an input coupled to the test-input terminal of the test control stage, a control terminal for receiving TE, another control terminal for receiving TEB, and an output terminal, and
wherein the output terminals of the tri-state inverters are coupled to a common node that is coupled to the output terminal of the test control stage.

11. The PMSFF of claim 10, wherein the first clock signals are delayed relative to corresponding second clock signals by an amount of time $t_{delay}$ where $t_{delay}$ is substantially equal to a sum of a propagation delay through the first tri-state inverter of the test control stage, a propagation delay through the transmission gate and a propagation delay through the inverter of the storage element of the master stage.

12. The PMSFF of claim 10, including a delay element coupled between the test-input terminal of the PMSFF and the input terminal of the test control stage, wherein the delay element delays the test-input signal by the amount of time $t_{delay}$.

13. The PMSFF of claim 10, including additional circuitry for changing behavior of MCLK based on a value of TE, the additional circuitry including:
a delay element having an input terminal for receiving CLK and an output terminal, the delay element delaying CLK by the amount of time $t_{delay}$,
a first tri-state inverter having an input terminal coupled to the output terminal of the delay element, a control terminal for receiving TE, another control terminal for receiving TEB, and an output terminal, and
a second tri-state inverter having an input coupled to the output terminal of the delay element, a control terminal for receiving TE, another control terminal for receiving TEB, and an output terminal,
wherein the output terminals of the tri-state inverters are coupled to a common node that provides MCLK to the PMSFF, and
wherein MCLK is delayed by the amount of time $t_{delay}$ when the PMSFF is in a normal mode, and MCLK is not delayed when the PMSFF is in a test mode.

14. A circuit, comprising:
a dynamic circuit module having at least one output terminal for outputting dynamic digital data based on a clock signal (CLK); and
a parallel master-slave flip-flop ("PMSFF") having an input terminal for receiving the dynamic digital data and an output terminal for outputting a data-out signal, the PMSFF further comprising:
a master stage comprising an input terminal for receiving the dynamic digital data, an output terminal, and terminals for receiving first clock signals (MCLK and MCLKB), the master stage configured to latch data at the master stage and to output the data latched at the master stage based on the first clock signals, wherein the master stage includes:
a transmission gate, coupled to the input terminal of the master stage, having a control terminal to receive MCLK, another control terminal to receive MCLKB, and an output terminal,
a storage element coupled to the output terminal of the transmission gate, and
a NAND gate having a first input terminal coupled to the storage element, a parallel input terminal coupled to the input terminal of the master stage, and an output terminal that provides an output terminal of the master stage; and
a slave stage comprising an input terminal coupled to the output terminal of the master stage, an output terminal for outputting the data-out signal, and terminals for receiving second clock signals (CLK and CLKB), the slave stage configured to latch data at the slave stage and to output the data latched at the slave stage based on the second clock signals.

15. The circuit of claim 14, wherein MCLK is delayed relative to CLK by an amount of time $t_{delay}$, and MCLKB is delayed relative to CLKB by the amount of time $t_{delay}$.

16. The circuit of claim 14, wherein the dynamic digital data is in a stable high state, when the master stage of the PMSFF is non-transparent.

17. The circuit of claim 14, wherein the dynamic circuit module includes at least one improved sense amplifier having an output terminal for providing the at least one output terminal of the dynamic circuit module.

18. The circuit of claim 17, wherein the dynamic circuit module includes a static random access memory coupled to the sense amplifier.

19. A memory system, comprising:
a static random access memory including a bitcell, the bitcell having terminals for outputting an intermediate differential voltage when the bitcell is accessed, the bitcell having a differential development time for developing the intermediate differential voltage;

an improved sense amplifier for receiving the intermediate differential voltage and for outputting a differential voltage; and a parallel master-slave flip-flop ("PMSFF") having an input terminal for receiving the differential voltage and an output terminal for outputting a data-out signal, the PMSFF including:

a master stage comprising an input terminal for receiving the differential voltage, an output terminal, and terminals for receiving first clock signals (MCLK and MCLKB), the master stage configured to latch data at the master stage and to output the data latched at the master stage based on the first clock signals, the master stage having a setup time, wherein the master stage includes:

a transmission gate, coupled to the input terminal of the master stage, having a control terminal to receive MCLK, another control terminal to receive MCLKB, and an output terminal, a storage element coupled to the output terminal of the transmission gate, wherein the storage element either latches the differential voltage or is transparent, depending on MCLK and MCLKB, and a two-input logic gate having a first input terminal coupled to the storage element, a parallel input terminal coupled to the input terminal of the master stage, and an output terminal that provides an output terminal of the master stage; and a slave stage comprising an input terminal coupled to the output terminal of the master stage, an output terminal for outputting the data-out signal, and terminals for receiving second clock signals (CLK and CLKB), the slave stage configured to latch data at the slave stage and to output the data latched at the slave stage based on the second clock signals.

20. The memory system of claim 19, wherein an increase in the differential development time of the bitcell is proportional to a decrease in the setup time of the master stage of the PMSFF.

* * * * *